(12) United States Patent
Seely et al.

(10) Patent No.: US 6,775,154 B1
(45) Date of Patent: Aug. 10, 2004

(54) ELECTROMAGNETIC BAFFLE FOR PRINTED CIRCUIT BOARDS

(75) Inventors: Warren L. Seely, Chandler, AZ (US); Ronald D. Fuller, Chandler, AZ (US); Robert W. Zienkewicz, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/417,739

(22) Filed: Apr. 16, 2003

(51) Int. Cl.[7] .................................................. H05K 9/00
(52) U.S. Cl. ........................................ 361/818; 361/816
(58) Field of Search ................................ 361/753, 799, 361/800, 816, 818, 2.2, 220, 752, 796; 174/35 R, 35 GC; 257/659, 660, 728, 704; 333/246, 204, 208, 212, 227

(56) References Cited

U.S. PATENT DOCUMENTS 5,014,160 A * 5/1991 McCoy, Jr. .................. 361/818
5,550,713 A * 8/1996 Pressler et al. ............. 361/818

* cited by examiner

Primary Examiner—Phuong T. Vu
(74) Attorney, Agent, or Firm—Frank J. Bogacz

(57) ABSTRACT

An electromagnetic baffle arrangement includes a lid (22) having a trough or air gap (30) in the side walls of each cavity (23) of lid (22). Conductive strips (28) are applied to a layer of printed circuit board (26) and each of the legs (31) of lid (22). Optionally, to eliminate circulation of electromagnetic signals within air gap (30) a grounded bolt (32) may be inserted aperiodically.

14 Claims, 1 Drawing Sheet

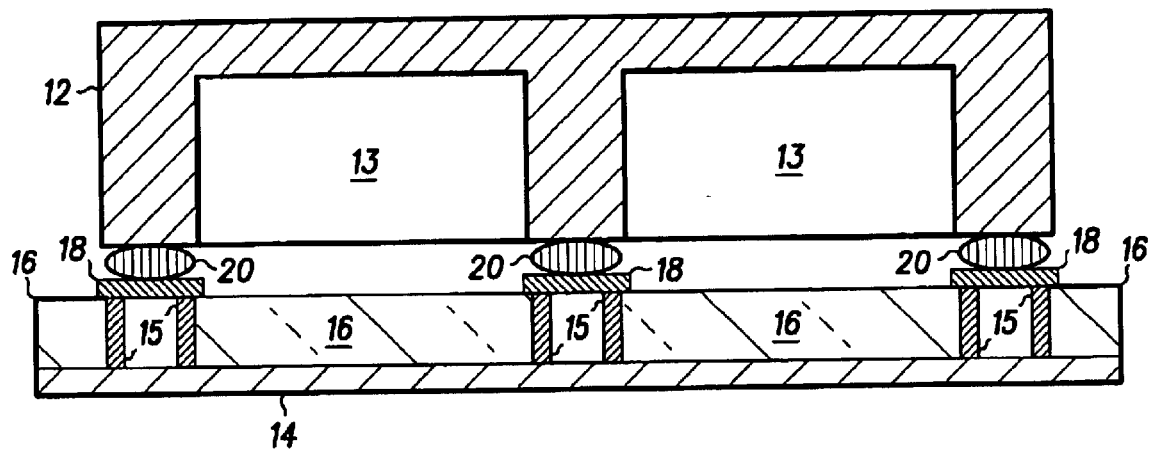
*- PRIOR ART -* FIG. 1
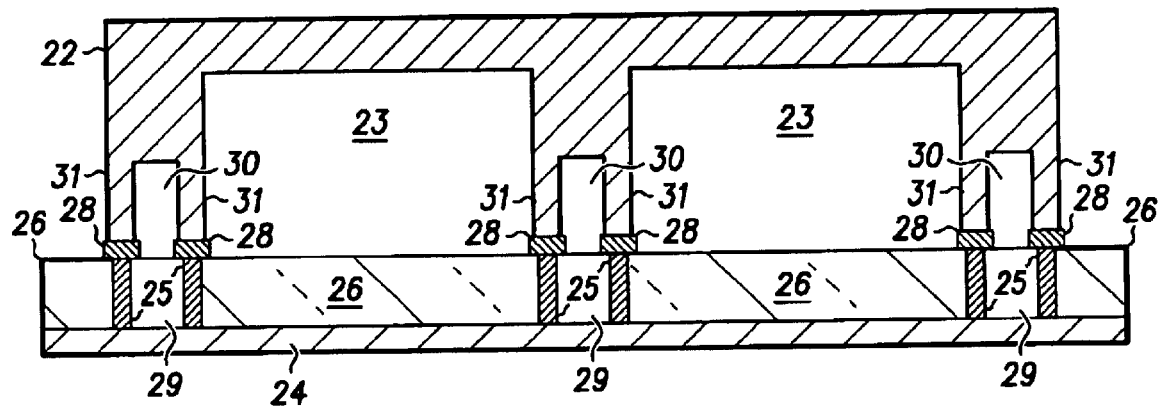
FIG. 2
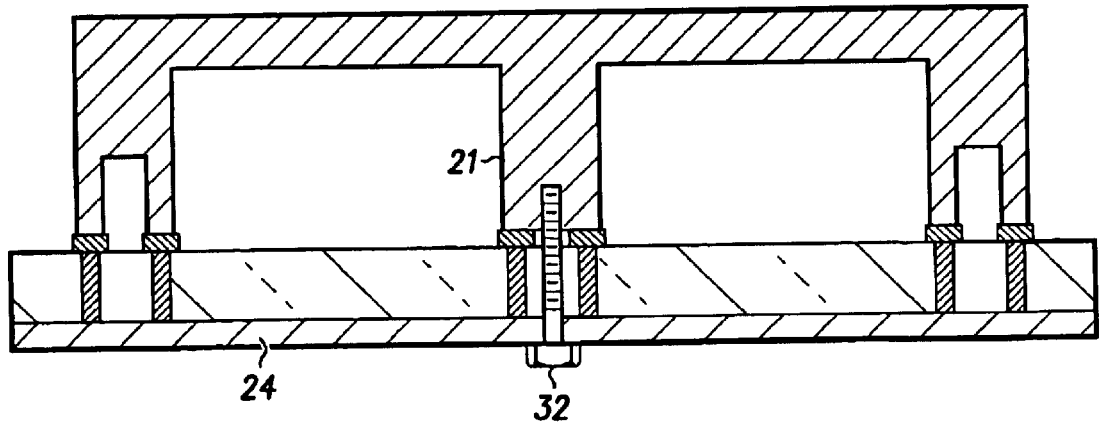
FIG. 3

ELECTROMAGNETIC BAFFLE FOR PRINTED CIRCUIT BOARDS

BACKGROUND OF THE INVENTION

The present invention pertains to electromagnetic emissions and more particularly to an arrangement for shielding printed circuit boards from electromagnetic emissions.

Today's printed circuit boards (PCBs) are complex, multi-layered structures on which highly integrated electronic circuitry is affixed and connected. Various circuit functions such as processors, memory, etc. often operate at high frequencies and generate considerable electromagnetic fields and interference. These fields and interference may affect other circuit functions which are located upon the printed circuit board or nearby located printed circuit boards. Further, in an effort to highly concentrate and miniaturize electronic circuitry and equipment required for the implementation of various functions, PCBs may be located near one another. Thereby, one PCB may be subjected to the electromagnetic emissions of a closely located PCB.

Current solutions to the problem of electromagnetic emissions involve shielding circuitry on a PCB from other circuitry on the same PCB or closely located PCBs. Removable shields pose a particular problem since they can not easily be soldered. A current solution to this problem involves bolting a metallic shield over the affected PCB or portion of the PCB. This solution includes a metallic shield which has a cavity to fit over the affected circuitry. This shield provides for diminishing electromagnetic emissions both from the circuit outward and to the circuit from outside sources or other circuits.

Current solutions to the electromagnetic shielding problem typically involves sealing the lid which has a cavity or cavities to the printed circuit board. This seal is typically achieved by providing a pliable conductive gasket material which is positioned at the interface between the PCB and the lid to facilitate electrical contact and continuity between the shield and the surface of the PCB. The gasket material is expensive and requires extra production steps to apply the gasket material appropriately between the lid and the PCB. The gasket material presents further problems in that over time the gasket material degrades due to corrosion. In addition the gasket material deforms and loses its pliability. Each of these deficiencies leads to higher electromagnetic emissions than can be tolerated by circuitry. As a result the performance of the circuitry may deteriorate over time along with the gasket material.

What is needed is a shielding arrangement which eliminates the need for the pliable gasket material, thereby reducing costs while simultaneously providing better electromagnetic shielding of emissions.

BRIEF DESCRIPTION OF THE DRAWING

FIG. 1 is a cross-section diagram depicting a typical prior art solution.

FIG. 2 is a cross-section of an electromagnetic baffle arrangement in accordance with the present invention.

FIG. 3 is a cross-section diagram of an embodiment of the present invention as shown in FIG. 2 depicting another embodiment of the present invention.

DESCRIPTION OF THE PREFERRED EMBODIMENT OF THE INVENTION

FIG. 1 depicts a cross-section diagram of a prior art apparatus for shielding from electromagnetic emissions. Assembly 10 includes printed wiring board (PCB) 16 having a ground plane 14 coupled to one surface of PCB 16. PCB 16 may be a multi-layer with, for example eight distinct layers or more, under present circuit board technology. Electronic ground is fed from ground plane 14 through each of the layers of PCB 16 by metal vias 15. Metal vias 15 at the top layer of PCB 16 are covered with a conductive strip 18. This strip is placed along the entire periphery of lid 12 and between cavities 13. Pliable gasket material 20 is placed along conductive strip 18 so as to contact the entire periphery of lid 12 and of each cavity 13.

Lid 12 is typically comprised of aluminum which is then plated with nickel over copper. Initially during the design phase the lid is machined to the particular shape and size needed. Once the design is finalized the lid 12 may then be cast.

Conductive strip 18 is typically a copper strip of approximately 0.7 mils in thickness. Pliable gasket material 20 typically includes a rubber gasket impregnated with particles of silver plated copper. Copper is initially a good conductor to form an emission free seal; however, copper oxidizes over time and provides less conductivity. Silver on the other hand provides good conductivity initially and as it oxidizes provides better conductivity.

Lid 12 is then fastened to PCB 16 via fasteners such as screws or bolts (not shown). As the fastening of lid 12 to PCB 16 occurs, pliable gasket material 20 is compressed and forms an electronic connection between lid 12 and ground plane 14 by means of vias 15. This arrangement helps minimize the amount of electromagnetic emission output by the surface mounted circuitry on PCB 16 or inhibits emissions from other circuitry entering into the surface mount circuitry of PCB 16.

Pliable gasket material 20 is a relatively expensive commodity and requires extra production steps to apply, form and seal the lid 12 to the PCB. In addition, pliable gasket material 20 degrades over time and temperature and the seal against electromagnetic emission likewise degrades over time. Therefore the elimination of gasket material 20 is highly desirable.

Turning now to FIG. 2, a cross-section diagram of an electromagnetic baffle arrangement according to the present invention is shown. Electromagnetic baffling is highly desirable for printed circuit boards in such applications as telecommunication systems. Mobile or wireless telecommunication systems which generate and are sensitive to high frequency emissions particularly benefit from such baffling. These mobile or wireless communication systems have many printed circuit boards whose performance greatly benefits from shielding or baffling arrangements.

Similar to FIG. 1, FIG. 2 depicts PCB 26 having a ground plane 24. Electronic ground of ground plane 24 is coupled through the multi-layers of PCB 26 by means of metal vias 25.

Lid 22 is a typical aluminum lid which is plated with nickel over copper. Lid 22 may include multiple cavities for protecting various electronic circuit functions from electromagnetic emissions.

Different from the arrangement of FIG. 1, lid 22 as shown in FIG. 2 has a trough cut into the edge of the lid about the entire periphery and between each of the cavities in the multi-cavity arrangement. That is, from the cross-section view, lid 22 now appears to have two distinct legs 31 which contact PCB 26.

Another difference from the arrangement of FIG. 1 is that metal vias 25 are not coupled with conductive strip 28.

Conductive strip 28 is applied to metal vias 25 separately. When lid 22 is attached to PCB 26, legs 31 of lid 22 each contact a separate metal via 25. Thereby, when lid 22 and PCB 26 are attached by fasteners such as screws or bolts (not shown), an air gap 30 is formed about the entire periphery of each of the cavities 23. Further, since each of the vias 25 is not connected by conductive strip 28, a dielectric gap 29 is formed between vias 25 and the air gap 30.

With respect to the surface mount electronics within each cavity 23, the electromagnetic emissions see a high impedance 30 from cavity 23 itself; a low impedance from the inner via 25 closest to cavity 23; a relatively high impedance of air gap 30; a low impedance of the outer via 25 and a high impedance of the outer environment. As a result, a high, low, high, low, high filter is provided by the subject electromagnetic baffle arrangement which provides for steeper cutoff frequencies and a high level of attenuation.

Not only are the electromagnetic emissions substantially attenuated by the present arrangement, but the pliable gasket 20 of FIG. 1 is eliminated. As a result, the cost of the pliable gasket material 20 is saved. Further, process steps in the manufacture of the printed circuit board arrangement may be eliminated for application and forming the gasket are eliminated. As a result the cost of the process steps is also saved.

Since an air gap trough exists around each cavity, any electromagnetic emissions within the cavity may circulate throughout the entire cavity. Accordingly, FIG. 3 provides an alternate embodiment of the arrangement of FIG. 2 wherein the circulation of electromagnetic emissions may be eliminated or at least substantially attenuated by the application of a stop bolt 32. FIG. 3 depicts lid 22 having a small portion 21 not hollowed out to form the air gap 30. That is, area 21 of lid 22 is solid aluminum material as is the lid itself. Breaks in the air gap 30 are about 2/10 of an inch and are pseudo-randomly disposed about the periphery of air gap 30. In a preferred embodiment there may be a discontinuity 21 approximately every two to four inches of the air gap. In order to provide a path to ground for any electromagnetic emissions within air gap 30, a bolt 32 may simply be inserted into break portion 21 of lid 22. The metallic connection forms a path for any electromagnetic emission to the ground plane 14.

It is noted that the electromagnetic baffle arrangement constitutes a filter arrangement for a printed circuit board 26 which eliminating electromagnetic emissions to and from the printed circuit board 26. The filter arrangement has a high impedance parallel L-C filter which includes a metal lid 22 having a cavity 23 coupled to the printed circuit board 26 in the preferred embodiment. The filter also has a low impedance L-C series shunt to ground filter which includes a conductive strip 28 on a first surface of the PCB 26 coupled to a first edge 31 of the metal lid 22 and coupled through a metal via 25 to a ground plane 24 on a second surface of the PCB 26. The filter further has a high impedance parallel L-C filter which includes an air gap 30 between the first edge of the metal lid and a second edge 31 of the metal lid and the first surface of the PCB 26. The filter has, in addition, a low impedance L-C series shunt to ground filter which includes a conductive strip 28 coupled on the first surface of the PCB 26 coupled to a second edge 31 of the metal lid 22 and coupled through a metal via 25 to the ground plane 24 on the second surface of the PCB 26. The filter lastly has a high impedance filter comprising an outer environment to the lid and PCB assembly.

As can be seen, the electromagnetic baffling arrangement is particularly useful in shielding the electronics in communications application such as base station transceivers or computing applications.

As can be appreciated by the previous explanation, this shielding arrangement eliminates the need for conductive gaskets, thereby reducing the unit cost of PCBs which require shielding. Furthermore, the performance of these PCB circuits will not degrade over time due to decomposition or corrosion of the gasket material.

Lastly, electrical isolation is improved over conventional arrangements due to first, the multi-sectional nature of a filter which has the high impedance, low impedance, high impedance, low impedance, high impedance nature of the filtering provided by the electromagnetic baffle arrangement; and second, an inclusion of the inner layers of the multi-layer PWC substrate as part of the shielding structure.

Although the preferred embodiment of the invention has been illustrated, and that form described in detail, it will be readily apparent to those skilled in the art that various modifications may be made therein without departing from the spirit of the present invention or from the scope of the appended claims.

What is claimed is:

1. An electromagnetic baffle arrangement comprising:
   a printed circuit board (PCB) having a first surface comprising a ground plane;
   a lid having a cavity, the lid including a gap about a periphery of an edge of the lid to form parallel contiguous first and second edges of the edge, the gap being contiguous between the first and second edges; and
   the printed circuit board having a second surface including first and second conductive strips respectively contacting the first and second edges of the lid respectively; and
   wherein the lid includes a metal lid comprising aluminum plated with nickel over copper.

2. The electromagnetic baffle arrangement an claimed in claim 1, wherein there is further included metal vias coupled from the ground plane, through the PCB to the first and second edges of the lid.

3. The electromagnetic baffle arrangement as claimed in claim 1, wherein each of the first and second conductive strips are contiguous about the cavity.

4. The electromagnetic baffle arrangement as claimed in claim 1, wherein each of the first and second conductive strips are discontiguous between the first and second edges.

5. The electromagnetic baffle arrangement as claimed in claim 1, wherein the cavity includes a plurality of cavities, each of the plurality of cavities including a gap about the periphery of the edge and of the cavity thereby forming first and second edges about each of the plurality of cavities.

6. The electromagnetic baffle arrangement as claimed in claim 1, wherein the electronic baffle arrangement includes an impedance arrangement including:
   a high impedance portion including the cavity;
   a low impedance portion including the first edge, conductive strip and metal via;
   a high impedance portion including the gap; and
   a low impedance portion including the second edge, conductive strip and metal via.

7. The electromagnetic baffle arrangement as claimed in claim 1, wherein;
   the gap includes a discontinuity; and
   means for coupling the discontinuity to the ground plane.

8. In a communication system, an electronic baffle arrangement for a printed circuit board, the electronic battle comprising:

the printed circuit board (PCB) having a first surface comprising a ground plane;

a lid having a cavity, the lid including a gap in an edge about a periphery of the lid to form parallel contiguous first and second edges, the gap being contiguously between the first and second edges;

the printed circuit board having a second surface including first and second conductive stripe contacting the first and second edges of the lid respectively; and wherein the lid includes a metal lid comprising aluminum plated with nickel over copper.

9. In a communication system, the electromagnetic baffle arrangement au claimed in claim 8, wherein there is further included metal vias coupled from the ground plane, through the PCB to the first and second edges of the lid.

10. In a communication system, the electromagnetic baffle arrangement as claimed in claim 8, wherein the first and second conductive strips are contiguous about the cavity.

11. In a communication system, the electromagnetic baffle arrangement as claimed in claim 8, wherein the first and second conductive strips are discontiguous between the first and second edges.

12. In a communication system, the electromagnetic baffle arrangement as claimed in claim 8, wherein the cavity includes a plurality of cavities, each of the plurality of cavities including a gap about the periphery of the edge and of the cavity thereby forming first and second edges about each of the plurality of cavities.

13. In a communication system, the electromagnetic baffle arrangement as claimed in claim 8, wherein the electronic baffle arrangement includes an impedance arrangement including:

a high impedance portion including the cavity;

a low impedance portion including the first edge, conductive strip and metal via;

a high impedance portion including the gap; and a low impedance portion including the second edge, conductive strip and metal via.

14. The electromagnetic baffle arrangement as claimed in claim 8, wherein:

the gap includes a discontinuity; and means for coupling the discontinuity to the ground plane.

* * * * *